United States Patent [19]

Cohen

[11] Patent Number: 5,430,405
[45] Date of Patent: Jul. 4, 1995

[54] CONTROL CIRCUIT FOR CONVERTERS OPERATING IN THE DISCONTINUOUS MODE

[75] Inventor: Isaac Cohen, Dix Hills, N.Y.
[73] Assignee: Lambda Electronics Inc., Melville, N.Y.
[21] Appl. No.: 929,761
[22] Filed: Aug. 12, 1992
[51] Int. Cl.⁶ .................. H02M 3/335; H03K 17/687
[52] U.S. Cl. ........................ 327/581; 327/590; 363/21
[58] Field of Search ............ 307/360, 571, 300, 280, 307/494, 497, 498, 296.3, 253, 246; 363/21, 41

[56] References Cited

U.S. PATENT DOCUMENTS

| | | | |
|---|---|---|---|
| 4,634,903 | 1/1987 | Montorfano | 307/571 |
| 4,709,316 | 11/1987 | Ngo et al. | 363/21 |
| 4,837,670 | 6/1989 | Diaz | 363/21 |
| 4,847,742 | 7/1989 | Ohashi et al. | 363/21 |
| 4,899,065 | 2/1990 | Nakamura | 307/571 |
| 4,904,889 | 2/1990 | Chieli | 307/571 |
| 4,985,821 | 1/1991 | Cohen | 363/95 |
| 5,140,201 | 8/1992 | Venishi | 307/571 |

OTHER PUBLICATIONS

Dragan Maksimovic and Slobodan Cuk, Switching Converters with Wide DC Conversion Range, HFPC. May 1989.

Primary Examiner—Timothy P. Callahan
Assistant Examiner—My-Trang Nu Ton
Attorney, Agent, or Firm—Morgan & Finnegan

[57] ABSTRACT

A DC converter system for providing an output voltage to a load, employing a pulse width modulated switching is disclosed. The system includes a DC input voltage source and a control switch having an ON period and an OFF period. The control switch during the ON period conducts a current responsive to the voltage source. A controller is provided to vary the ON period and the OFF period of the switch, such that the ON period is inversely proportional to the voltage source and the OFF period is inversely proportional to the output voltage.

27 Claims, 5 Drawing Sheets

CONTROL CIRCUIT FOR CONVERTERS OPERATING IN THE DISCONTINUOUS MODE

BACKGROUND OF THE INVENTION

This invention relates to control circuits for power converters and more specifically to power converters having an overload protection and voltage-control capability.

For power converters, it is usually necessary to provide a control circuit for short circuit protection and for regulating the output voltage. Typically, this may be accomplished by measuring output current and interrupting the converter switch when the amplitude of current is at a certain point. Alternatively the input current flowing through the transistor switch or the primary of the converter may be measured and the transistor switch turned OFF when the input current reaches a certain point.

Major disadvantages of prior art control circuits include considerable bulk and power dissipation when high currents are measured. Furthermore, in case of low output power converters, the area occupied by the control circuit and its costs become considerably more burdensome than for high power ones.

A disadvantage with measuring current is also experienced when the converter has to operate over a wide range of power ratings. For different power ratings, different power sensing designs become necessary resulting in higher cost and less flexibility.

A further drawback is that for certain converter topologies there is little correlation between the value of the transistor switch current and the value of the output current. The class of converters wherein the measurement of switch current cannot be easily used for control of output current includes cascaded power converters, known as "quadratic" converters such as buck-boost-buck, buck-boost/buck-boost and other derivations of the "quadratic" converter class.

Therefore, it would be desirable to provide short circuit protection without having to sense currents.

SUMMARY OF THE INVENTION

It is therefore an objective of this invention to provide a control technique for power converters that does not depend on sensing currents.

It is a further objective of this invention to both provide control of the output voltage and overload protection without requiring the sensing of currents.

It is still a further objective of the present invention to provide both control of the output voltage and overload protection for cascaded converters.

It is also an objective of the present invention to provide control of the output voltage and overload protection for buck, boost, buck-boost and Cuk converters and any of their variations or combinations.

According to one aspect of the invention, the control circuit forces the converter to operate always in a discontinuous mode. In basic single-transistor, single-diode pulse width modulated power converters, the discontinuous mode of operation occurs When the diode current at the secondary of the converter drops to zero before the end of the switching transistor OFF time.

Therefore, according to one embodiment of the present invention, the ON time of the switching transistor is forced to be inversely proportional to the input voltage $V_{in}$, for buck-boost derived topologies and is forced to be inversely proportional to the difference between the input voltage $V_{in}$ and the output voltage $V_o$ for buck-derived topologies. The OFF time of the switching transistor is forced to be inversely proportional to the output voltage $V_o$. The converter will thereby be protected against overload.

Furthermore, the control of the output voltage can be accomplished by appropriate modulation of either the ON time, the OFF time or both.

BRIEF DESCRIPTION OF THE DRAWINGS

Serving to illustrate embodiments of the invention are the drawings of which.

DETAILED DESCRIPTION OF THE DRAWINGS

Figure 1:
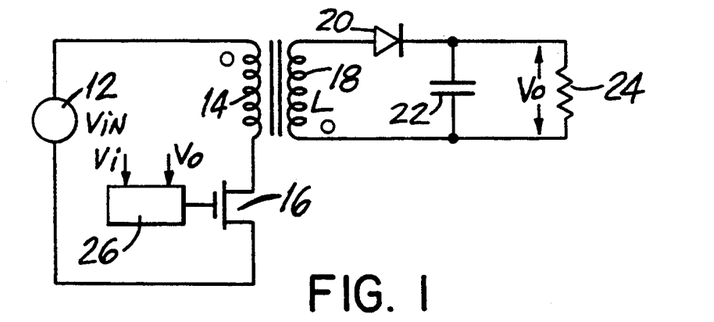
FIG. 1 illustrates a schematic diagram of a buck-boost converter.

FIG. 1 illustrates a schematic diagram of a buck-boost or a flyback converter. It can be appreciated by those skilled in the art that other variations of buck-boost derived converters may be also utilized according to the present invention. Voltage source 12 is coupled to a primary winding 14 having an inductance "L". The primary winding is connected in series with a transistor switch 16. The switching of transistor switch 16 is responsive to a controller 26. A secondary winding 18 having inductance L is coupled to a diode 20, at the diode's cathode terminal. The terminal of the diode is coupled to a capacitor 22. A load 24 is connected in parallel with capacitor 22.

The control technique according to the present invention requires that the converter operate in a discontinuous mode. When operated in the discontinuous mode, the converter, for each conduction pulse of the switch 16, delivers a "quantum" of energy defined by:

$$E = \frac{1}{2} L I_{PK}^2 \quad (1)$$

where L is the inductance of the flyback inductor and $I_{pk}$ is the peak current at the end of the conduction of the switch.

The peak current is given by:

$$I_{PK} = \frac{V_{in}}{L} \cdot t_{ON} \quad (2)$$

where Vin is the input voltage and $t_{ON}$ is the conductive time of transistor 16.

As demonstrated by equation (2), by making $t_{ON}$ inversely proportional to Vin, the peak current $I_{pk}$ can be kept constant. Thus a constant energy per conduction pulse may be provided to the output of the converter.

The primary winding 14 and secondary winding 18 of the flyback transformer may have a unity turn ratio. Therefore, at the instant the transistor switch turns OFF, a current $I_{pk}$ will appear in the secondary winding of the transformer. Since the rate of decay of the current is directly proportional to the output voltage, it is possible to force the converter to always operate in the discontinuous mode by making the OFF time of the converter transistor switch 16 inversely proportional to the output voltage:

$$t_{off} = \frac{I_{PK}L}{V_O} \quad (3)$$

Assuming that the peak current $I_{pk}$ is made constant by having $t_{ON}$ inversely proportional to the input voltage, the converter will be protected against overload under all conditions. The short circuit current will be:

$$I_{SC} = \frac{1}{2} I_{PK} \quad (4)$$

The conditions defined by equations (2) and (3) may be implemented by controller 26. The output voltage may be controlled by an appropriate modulation of either the ON time or the OFF time and alternatively by modulation of both the ON time and the OFF time.

Figure 2:
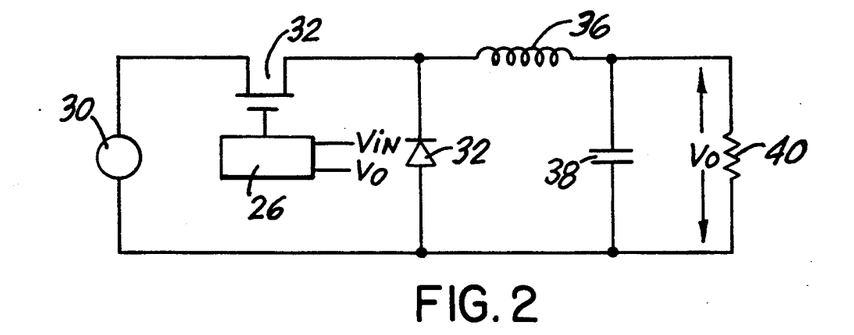
FIG. 2 illustrates a schematic diagram of a buck converter.

FIG. 2 illustrates a schematic diagram of a buck converter. It can be appreciated by those skilled in the art that other variations of buck-derived converters may also be implemented according to the present invention.

In the converter, voltage source 30 is coupled to a transistor switch 32. The transistor switch is connected in series to an cathode terminal of a diode 34. The cathode terminal of the diode is also connected to a terminal of an inductor 36 with an inductance "L". The other terminal of the inductor is connected to one terminal of a capacitor 38 and one terminal of a load 40. The other terminal of the capacitor and the load are connected together and to the anode of diode 34. Transistor switch 32 is responsive to a control circuit 26 according to the present invention for turning the transistor switch ON and OFF.

The principles of operation explained before for the buck-boost example of FIG. 1 can be extended to buck-derived converters. Therefore, it is possible to control the peak current $I_{pk}$ of the switch, and consequently, the peak current of the converter's inductor 36, by making the ON time inversely proportional to the difference between the input voltage $V_{in}$ and the output voltage Vo:

$$I_{PK} = \frac{V_{in} - V_O}{L} \cdot t_{ON} \quad (5)$$

$$t_{ON} = \frac{I_{PK} \cdot L}{V_{in} - V_O} = \frac{K_a}{V_{in} - V_O} \quad (6)$$

where L is the inductance of inductor 36.

Since the current in the inductor is at all times a triangular wave of amplitude $I_{pk}$, the output current will be:

$$I_O = \frac{I_{PK}}{2} \quad (7)$$

for all overload conditions including short circuit.

The output voltage can be controlled by modulating either the ON or OFF time or both.

Figure 3A:
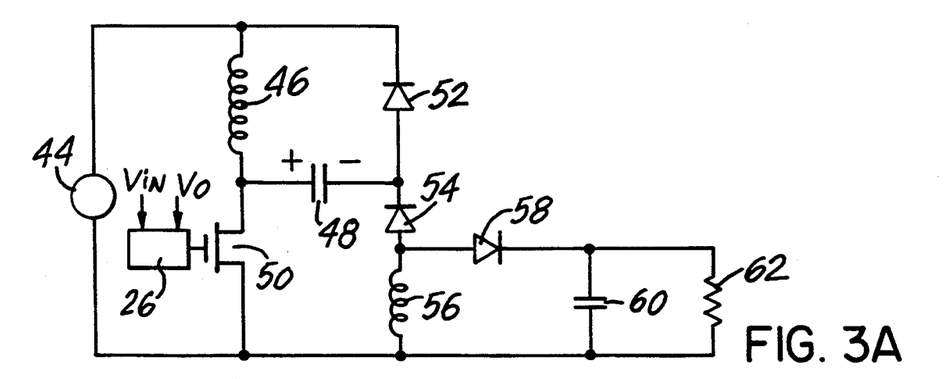
FIGS. 3A-3B illustrates cascaded buck-boost/buck-boost converters.
Figure 3B:
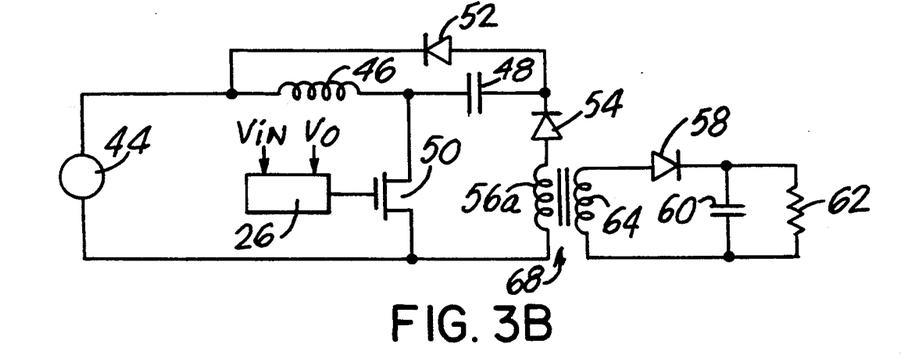

FIGS. 3A and 3B illustrate cascaded buck-boost-/buck-boost converters. The circuit of FIG. 3B is similar to that of FIG. 3A except for the transformer 68 having primary and secondary windings.

As illustrated in FIG. 3A, the voltage source 44 provides voltage Vin. Voltage source 44 is connected in series to an inductor 46. Inductor 46 is connected to a diode 52 at their first respective terminals. Connected between the other terminals of diode 52 and inductor 46 is a capacitor 48.

A transistor switch 50 is connected in series to the terminal of common to inductor 46, and capacitor 48. Transistor 50 is responsive to a control circuit 26 according to the present invention for turning the transistor ON or OFF. The common terminal of capacitor 48 and the anode of diode 52 is connected to the anode of diode 54. The anode of diode 54 is connected to the common junction of an inductor 56 and the anode of a diode 58.

The anode of the diode 58 is connected to a capacitor 60. Capacitor 60 is in turn connected in parallel to a load 62.

As mentioned earlier, FIG. 3B is substantially similar to FIG. 3A. However inductor 56 of FIG. 3A may be isolated by including a primary winding 56a and a secondary winding 64.

The same control principles as explained for previous buck and buck-boost topologies may be extended to the cascade converters, according to the present invention.

It will be appreciated by those skilled in the art that the invention may be implemented with other variations of cascaded converters such as those described in an article published in May 1989 proceedings of HFPC (High Frequency Power Conversion) *Switching Converters With Wide DC Conversion Range*, pp. 217–225 (by Dragan Maksimovic and Slobadan Cuk, Power Electronics Group, California Institute of Technology). That publication is incorporated herein by reference.

The control topology according to the present invention is applicable to all classes of cascaded converters operating in a discontinuous mode.

Figure 4:
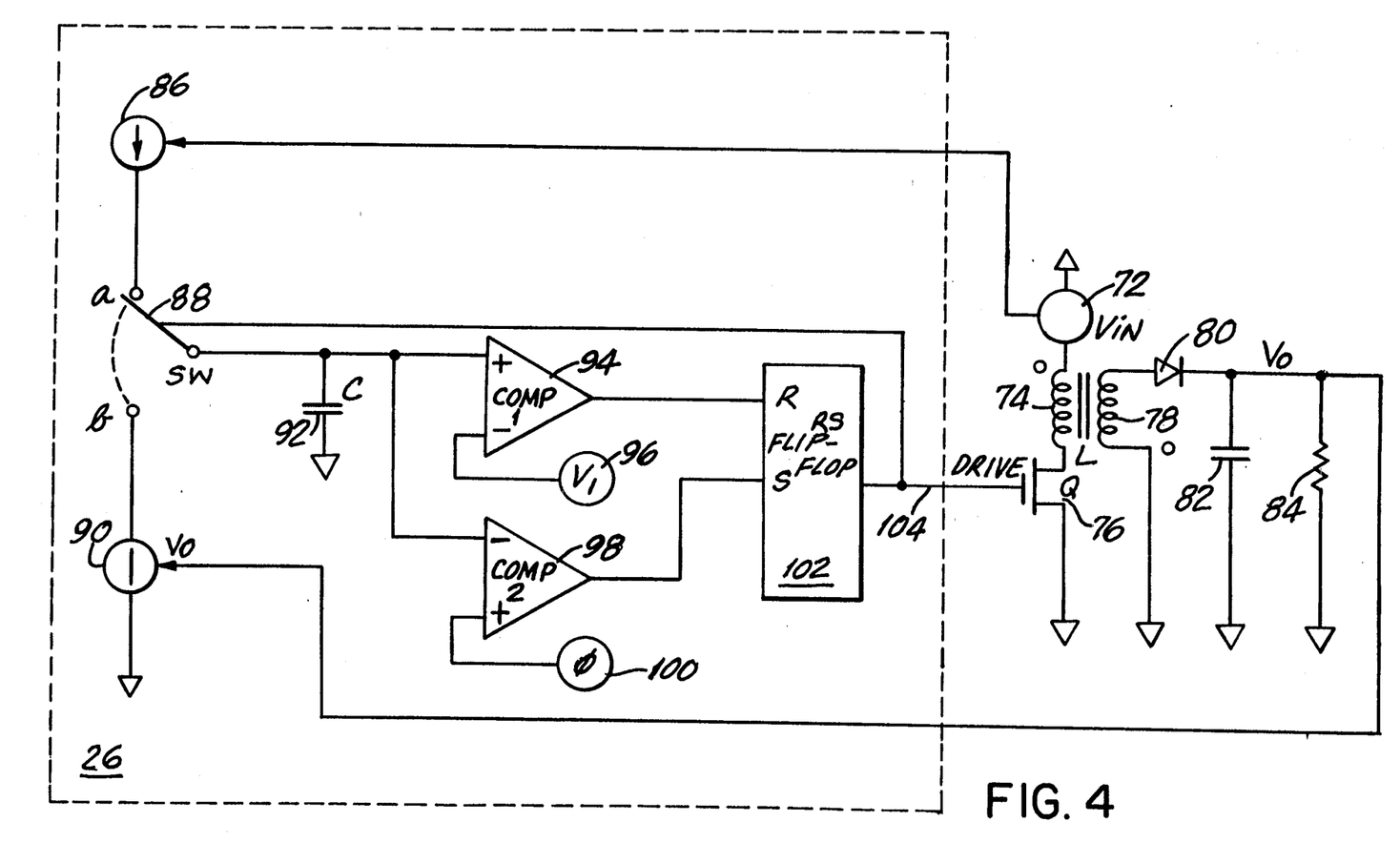
FIG. 4 illustrates a schematic diagram of one embodiment according to the present invention for overload protection of a buck-boost converter.

FIG. 4 illustrates a schematic diagram of one embodiment of the present invention for providing overload protection. Accordingly a buck-boost converter is provided and is controlled by controller 26.

Voltage source 72 is coupled to a primary winding 74 having an inductance "L". The primary winding is connected in series to a transistor switch 76. Transistor switch 76 is turned ON or OFF in response to a controller.

A secondary winding 78 having inductance L, which is substantially equal to the inductance of primary winding 74, is coupled to a diode 80 at the diode's anode terminal. The anode terminal of the diode is coupled to the parallel combination of a capacitor 82 and a load 84.

The controller 26 includes a current source 86 which is responsive to voltage $V_{in}$ of voltage source 72. Current source 86 may be a converter implemented with any one of the many known voltage-to-current circuits with its topology and parameters being selected according to desired specifications as explained hereinafter. It can be appreciated by those skilled in the art that in many cases a resistor may be utilized as a voltage-to-current converter circuit.

Current source 86 connects to a capacitor 92 via a switch 88 when the switch is in position "a". The other terminal of capacitor 92 is coupled to a ground or a common terminal.

The controller 26 also includes; a current source 90 which is responsive to voltage $V_o$. Current source 90 may be implemented in a manner similar to current source 86.

Current source 90 connects to capacitor 92 when the switch is in position "b".

Capacitor 92 is coupled to comparators 94 and 98. Accordingly, the capacitor is coupled to the non-inverting terminal of comparator 94 and to the inverting terminal of comparator 98.

The inverting terminal of comparator 94 is coupled to a voltage reference source 96 providing a reference voltage $V_1$. The non-inverting terminal of comparator 98 is coupled to a voltage reference source 100 which according to one embodiment provides a reference voltage of zero.

The outputs of comparators 94 and 98 are coupled to an RS flip-flop 102 with the output of comparator 94 being coupled to the R terminal of the flip-flop and the output of comparator 98 being coupled to the S terminal of the flip-flop. The output of the flip-flop drives transistor switch 76 via line 104 and controls switch 88 via line 106.

The control technique of controller 26 according to the present invention forces the converter to operate in a discontinuous mode. As an example of the operation, it is assumed that the output of flip-flop 102 is HIGH, the switch transistor 76 is ON and switch 88 is in position "a". Thus capacitor 92 will be charged by the current source 86 with a current I, given by:

$$I_{86} = K_1 V_{in} \tag{8}$$

When the voltage across capacitor 92 reaches a value $V_1$, the output of comparator 94 goes HIGH and therefore resets the flip-flop 102. When the output of the flip-flop goes LOW, switch transistor 76 turns OFF and switch 88 moves to position "b". Capacitor 92 is now being discharged by a current source 90 with a current $I_{90}$ given by:

$$I_{90} = K_2 V_o \tag{9}$$

When the voltage across capacitor 92 goes below zero volts, the output of comparator 98 goes HIGH, and sets the flip-flop. The flip-flop moves switch 88 back to position "a" and turns ON switch transistor 76. Thus the cycle is repeated.

As a result of the operation explained above, the control circuit 26 will generate an ON time for transistor switch 76 given by:

$$t_{ON} = \frac{CV_1}{K_1 V_{in}} \tag{10}$$

Since C, $V_1$ and $K_1$ are constants, they can be selected such that the condition set forth by equation (2) is fulfilled and therefore:

$$\frac{CV_1}{K_1} = I_{PK} \cdot L \tag{11}$$

The OFF time of transistor switch 76 will be equal to:

$$t_{OFF} = \frac{CV_1}{K_2 V_o} \tag{12}$$

Again the value of $K_2$ may be selected such that the condition set forth by equation (3) is fulfilled and therefore:

$$\frac{CV_1}{K_2} = I_{PK} L \tag{13}$$

Accordingly, the circuit illustrated by FIG. 4A and described above will provide a discontinuous operation at any load value, thereby providing full protection against overloads or short circuits.

Figure 5:
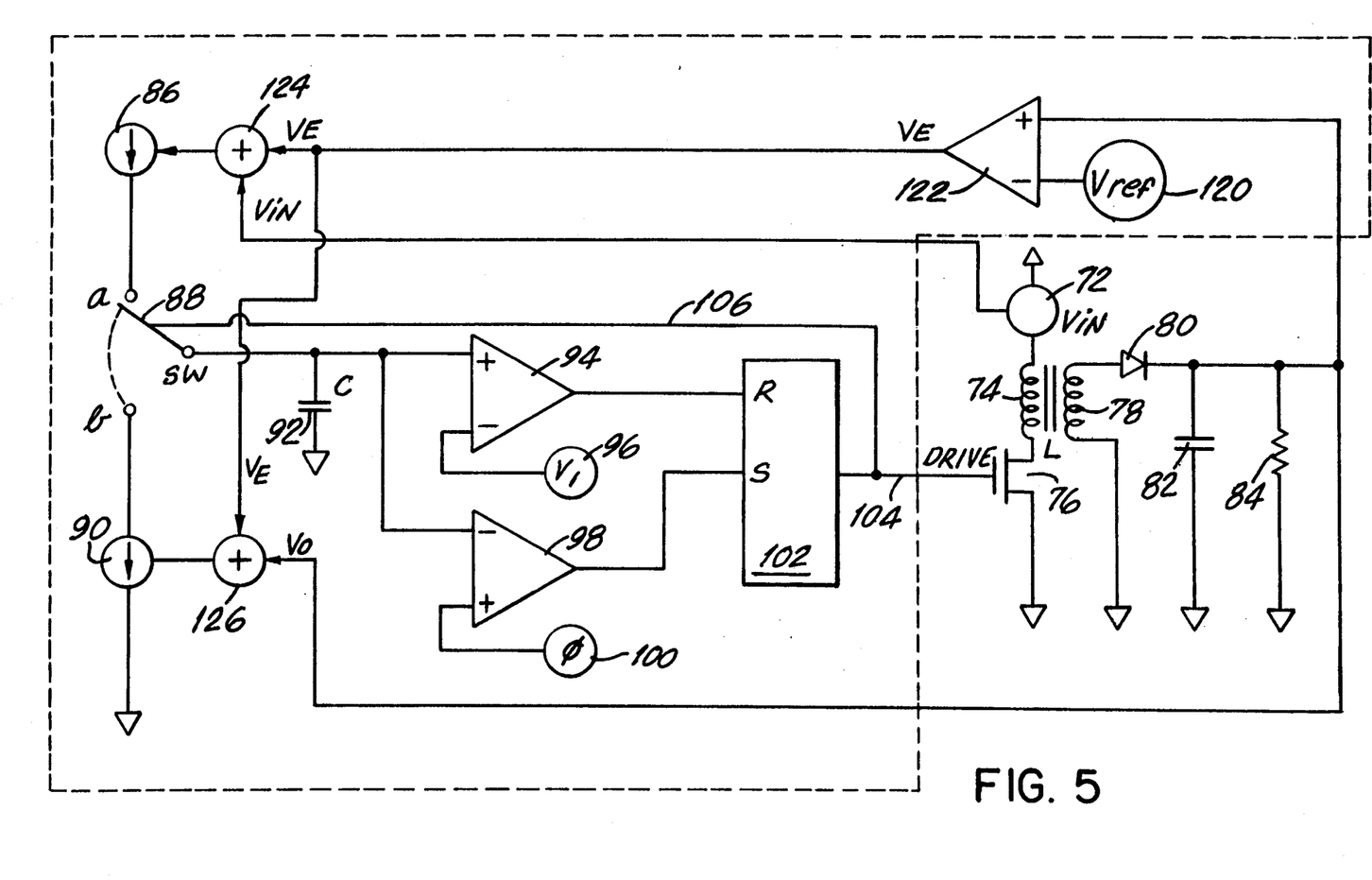
FIG. 5 illustrates a schematic diagram of one embodiment according to the present invention for both overload protection and control of output voltage.

FIG. 5 illustrates a schematic diagram of one embodiment of the invention for both overload protection as described and illustrated by FIG. 4 and for control of output voltage.

The circuit illustrated in FIG. 5 is derived by modifying the circuitry of FIG. 4. Thus an op-amp 122 is provided which is responsive to output voltage Vo and a reference voltage $V_{ref}$ provided by a voltage source 120. The output of op-amp 122 is supplied to one terminal of an adder 124. The other terminal of the adder is responsive to the voltage source Vin. The output of the adder controls the current source 86.

The output of the operational amplifier 122 is also connected to an adder 126. The other input terminal of adder 126 is responsive to the output voltage Vo. The output of adder 126 controls the current source 90.

The output voltage Vo of the converter can be controlled by op-amp 122 which operates as an error amplifier. Thus, the difference between the output voltage Vo and a reference voltage $V_{ref}$ generates an error voltage $V_E$.

The voltage $V_E$ can be used to control the current source 86 and 90 such that:

$$I_{86} = K_1 V_{in} + K_3 V_E \tag{14}$$

$$I_{90} = K_1 V_o - K_4 V_E \tag{15}$$

As a result, an increase of Vo above the value of $V_{ref}$ will cause a decrease in $t_{ON}$ and an increase in $t_{OFF}$, thereby establishing a closed loop on the output voltage. It will be appreciated by those skilled in the art that the output voltage may also be controlled by either controlling current source 86 or current source 90 only.

Figure 6:
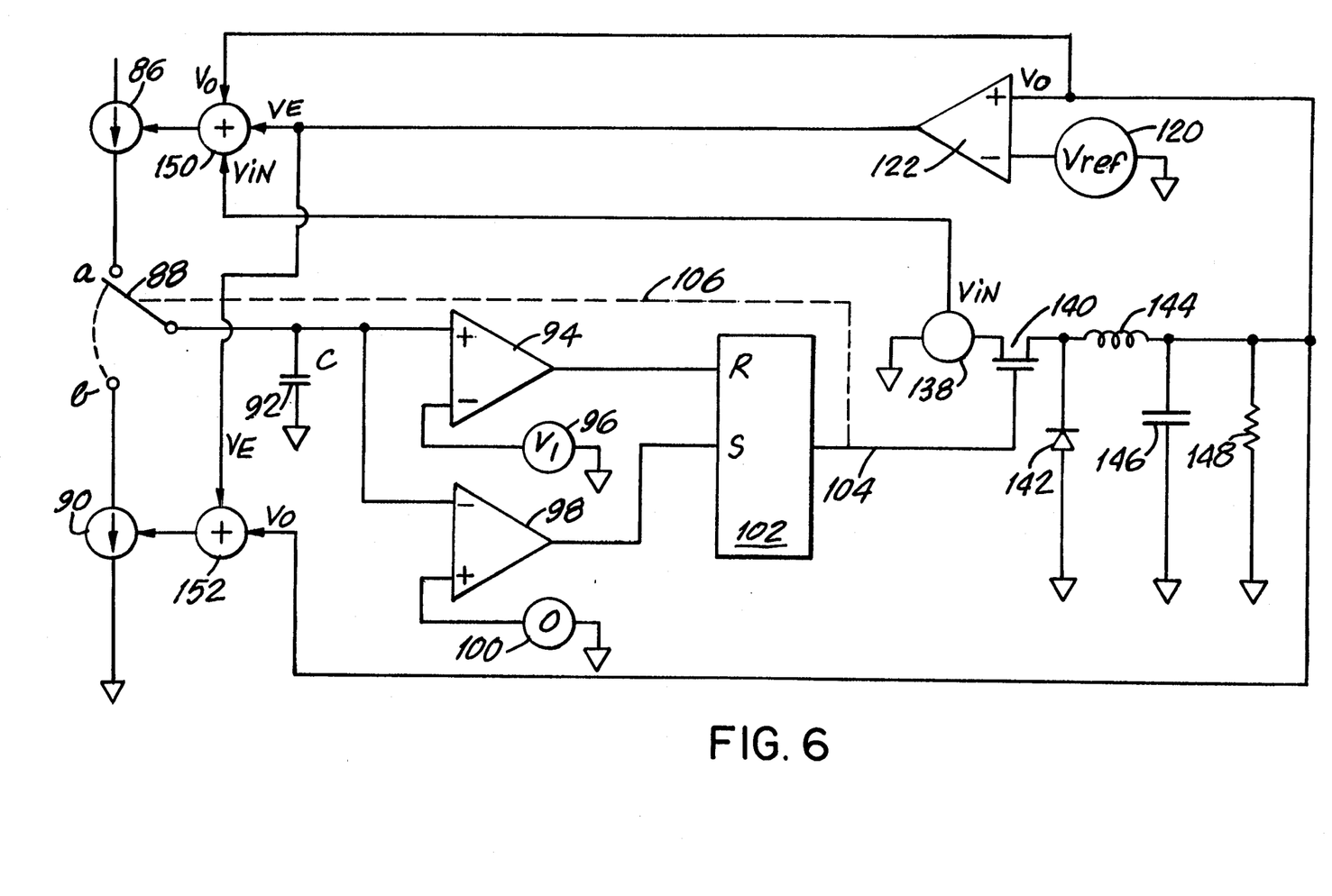
FIG. 6 illustrates a schematic diagram of another embodiment according to the present invention for both overload protection and control of output voltage.

FIG. 6 illustrates a schematic diagram of another embodiment according to the present invention for both overload protection and control of output voltage in a buck-derived converter.

The operation of the circuit as illustrated in FIG. 6 is similar to the one described in FIG. 5, the difference being that the current source 86 is controlled by:

$$I_{86} = K_1 V_{in} - K_1 V_o + K_3 V_E \tag{16}$$

However the current source 90 is controlled in a manner similar to FIG. 5 and thus:

$$I_{90} = K_2 V_o - K_4 V_E. \tag{17}$$

Similar to the circuit of FIG. 5, an increase of $V_o$ above the value of $V_{ref}$ will cause a decrease in $t_{ON}$ and an increase in $t_{OFF}$, thereby establishing a closed loop on the output voltage. The output voltage may also be controlled by either controlling current source 86 or current source 90 only.

Figure 7A:
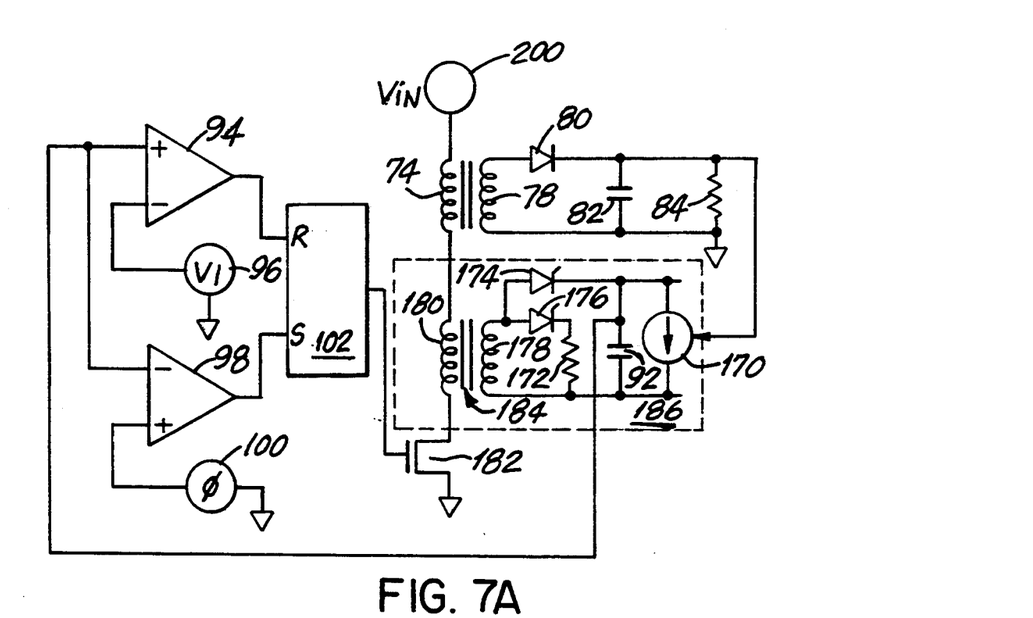
FIG. 7A illustrates another embodiment of the present invention for overload protection of a buck-boost converter utilizing switching transistor current sensing.

FIG. 7A illustrates another embodiment of the present invention utilizing transistor switch current sensing. Voltage source 200 is coupled to a converter which in this embodiment is illustrated as a buck-boost.

Accordingly, inductor winding 74 is coupled to voltage source 200. Secondary winding 78 is coupled to a diode 80 which in turn is connected to capacitor 82 and load 84.

A current sensing circuit 186 is coupled to the converter. The current sensing circuit includes a current transformer 184. The current transformer further includes a primary winding 180 which is connected in series with a transistor switch 182. The current transformer also includes a secondary winding 178 which is coupled to diodes 174 and 176. Diode 174 is connected in series with a capacitor 92 and a voltage controlled current source 170. Diode 176 is connected in series with resistor 172.

Capacitor 92 is coupled to a comparator circuit which includes two comparators 94 and 98. Capacitor 92 is connected to the non-inverting terminal of comparator 94 and to the inverting terminal of comparator 98. The inverting terminal of comparator 94 is coupled to a reference voltage source 96 providing a voltage $V_1$, and the non-inverting terminal of comparator 98 is connected to a voltage source 100 which provides zero voltage.

The output of comparators 94 and 98 are coupled to an RS flip-flop and the output of the flip-flop turns transistor switch 182 "ON" or "OFF".

The current sensing circuit 186 is described in the U.S. Pat. No. 4,985,821, for "Indirect Current Sensing Of DC To DC Converters," and is incorporated herein by reference. Accordingly, when transistor 182 turns ON, current transformer 184 provides current to secondary winding 178 and a voltage across resistor 172 develops. During the ON period, capacitor 92 is in parallel with resistor 172, and develops a charge. The voltage across the capacitor and resistor 172 are the same. The voltage developed across resistor 172 is directly proportional to the switch current. Therefore $t_{ON}$ may be controlled by fulfilling the control provision set forth by equation (2).

When transistor 182 turns OFF, capacitor 92 begins to discharge. The appropriate rate of discharge of capacitor 92 is established by the voltage-controlled current source 170. The current source accepts the output voltage $V_o$ of the converter as an input and generates a discharge current proportional to it, thereby causing the voltage to decay at a rate proportional to the output voltage of the converter. Therefore $$I_{170} = K_2 V_o \tag{18}$$

The proportionality constant $K_2$ may be derived as described in prior embodiments previously described.

Figure 7B:
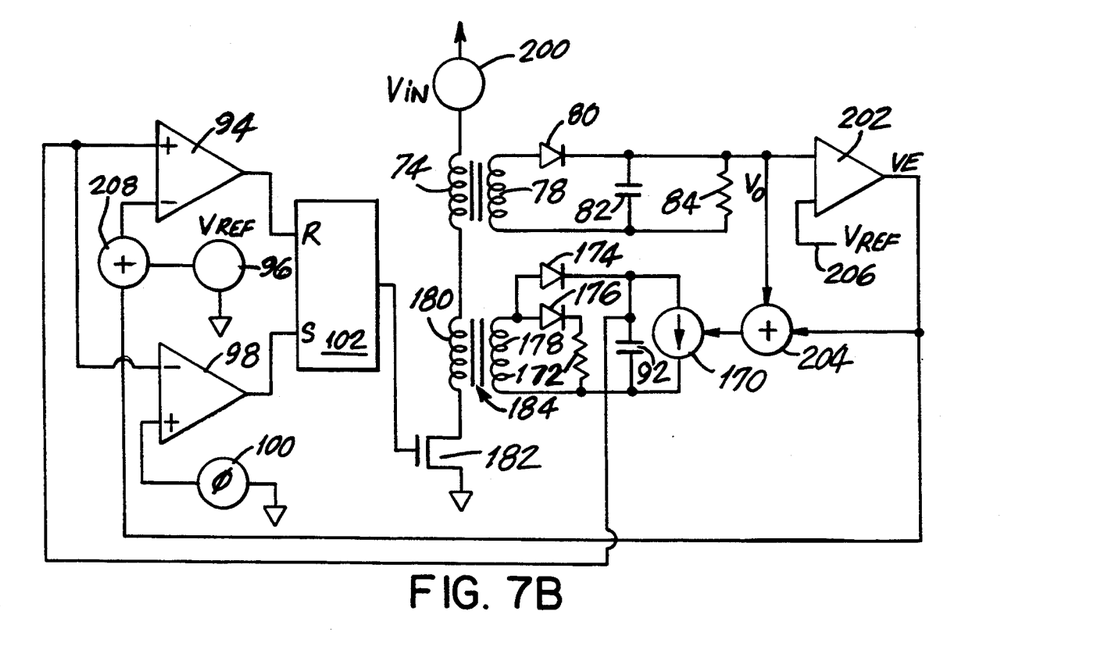
FIG. 7B illustrates a modification of the system of FIG. 7A for providing both overload protection and control of output voltage.

FIG. 7B illustrates a schematic diagram of the embodiment of the invention for both overload protection as described and illustrated by FIG. 7A, and for control of output voltage.

The circuit illustrated in FIG. 7B is a modification of the circuitry of FIG. 7A. Thus, an op-amp 202 is provided which is responsive to output voltage $V_o$ and a reference voltage $V_{ref}$ provided by a voltage source 206. The output of op-amp 202 is provided to one terminal of adders 204 and 208. The other terminal of adder 204 is responsive to output voltage $V_o$. The other terminal of adder 208 is responsive to a reference voltage source 96. Thus, the output of adder 204 controls the voltage-controlled current source 120, and the output of adder 208 controls the reference voltage provided to comparator 94.

Accordingly, the output voltage $V_o$ of the converter can be controlled by op-amp 122 which operates as an error amplifier. Thus, the difference between the output voltage $V_o$ and a reference voltage $V_{ref}$ generates an error voltage $V_E$.

The voltage $V_E$ can be used to control the voltage controlled current course 170 or the reference voltage provided to comparator 94 or both. As a result, the increase of $V_o$ above the value of $V_{ref}$ will cause a decrease in $t_{ON}$ and an increase in $t_{OFF}$, thereby establishing a closed loop on the output voltage.

Here too, as in the two prior cases, the converter may be buck or buck derived, boost or other types of converters.

It will be appreciated by those skilled in the art that the overload protection and output voltage control strategy disclosed herein can be implemented with various modifications of the described embodiments. Additionally, topologies other than the converters described herein may be controlled according to the control strategy described herein.

The invention in its broader aspects therefore is not limited to the specific embodiments described herein. Departures may be made therefrom within the scope of the accompanying claims without departing from the principles of the invention and without sacrificing its chief advantages.

I claim:

1. A DC converter system for providing an output voltage to a load, employing a pulse width modulated switching, said system comprising:
    an input stage having a substantially DC input voltage source;
    said input stage further comprising a control switch having an ON period and an OFF period, said control switch during said ON period conducting a current responsive to said voltage source;
    an output stage coupled to said input stage, said output stage including an output terminal providing said output voltage to the load during said ON period and said OFF period, the value of said output voltage dependent on the ON period relative to the OFF period; and
    a controller adapted to vary said ON period and said OFF period of said switch to provide discontinuous mode operation, such that said ON period is inversely proportional to said voltage source and said OFF period is inversely proportional to said output voltage.

2. The system according to claim 1, wherein said switch is a transistor switch, the gate of said transistor switch being responsive to said controller for turning ON and OFF.

3. The system according to claim 2, wherein said controller further comprises:
   first voltage controlled current source providing a charging current proportional to said input voltage;
   second voltage controlled current source providing a discharging current proportional to said output voltage; and
   capacitance means responsive to said first voltage controlled current source such that said transistor switch remains ON until said capacitance means is substantially charged by said charging current to a first predetermined voltage, said capacitance responsive to said second voltage controlled current source such that said transistor switch remains OFF until said capacitance means is substantially discharged by said discharging current to a second predetermined voltage.

4. The system according to claim 3, further comprising:
   first comparator means for providing an indication when voltage across said capacitance means is substantially equal to said first predetermined voltage; and
   second comparator means for providing an indication when voltage across said capacitance means is substantially equal to said second predetermined voltage.

5. The system according to claim 4 further comprising:
   error amplifier responsive to said output voltage, adapted to provide an error voltage when said output voltage deviates from a reference voltage; and
   means for coupling said error voltage with said input voltage such that said first voltage controlled current source is responsive to said input voltage and said error voltage.

6. The system according to claim 5, further comprising means for coupling said error voltage with said output voltage such that said second voltage controlled current source is responsive to said output voltage and said error voltage.

7. The system according to claim 6, wherein said DC converter is a cascaded converter.

8. A DC converter system for providing an output voltage to a load, employing a pulse width modulated switching, said system comprising:
   an input stage having a substantially DC input voltage source;
   said input stage further comprising a control switch having an ON period and an OFF period, said control switch during said ON period conducting a current responsive to said voltage source;
   an output stage coupled to said input stage, said output stage including an output terminal providing said output voltage to the load during said ON period and said OFF period, the value of said output voltage dependent on the ON period relative to the OFF period; and
   a controller adapted to vary said ON period and said OFF period of said switch to provide discontinuous mode operation, such that said ON period is inversely proportional to the difference between said voltage source and said output voltage and said OFF period is inversely proportional to said output voltage.

9. The system according to claim 8, wherein said switch is a transistor switch, the gate of said transistor switch being responsive to said controller for turning ON and OFF.

10. The system according to claim 9, wherein said controller further comprises:
    first voltage controlled current source providing a charging current proportional to the difference between said input voltage source and said output voltage;
    second voltage controlled current source providing a discharging current proportional to said output voltage; and
    capacitance means responsive to said first voltage controlled current source such that said transistor switch remains ON until said capacitance means is substantially charged by said charging current to a first predetermined voltage, said capacitance responsive to said second voltage controlled current source such that said transistor switch remains OFF until said capacitance means is substantially discharged by said discharging current to a second predetermined voltage.

11. The system according to claim 10, further comprising:
    first comparator means for providing an indication when voltage across said capacitance means is substantially equal to said first predetermined voltage; and
    second comparator means for providing an indication when voltage across said capacitance means is substantially zero.

12. The system according to claim 11 further comprising:
    error amplifier responsive to said output voltage, adapted to provide an error voltage when said output voltage deviates from a reference voltage; and
    means for coupling said error voltage with said input voltage source and said output voltage such that said first voltage controlled current source is responsive to a signal generated from said input voltage source, said output voltage, and said error voltage, said signal including the difference between said input voltage source and said output voltage.

13. The system according to claim 12, further comprising means for coupling said error voltage with said output voltage such that said second voltage controlled current source is responsive to said output voltage and said error voltage.

14. The system according to claim 13, wherein said DC converter is a cascaded converter.

15. A DC converter system for providing an output voltage to a load, employing a width modulated switching, said system comprising:
    an input stage having a DC input voltage source;
    said input stage further comprising a control switch having an ON period and an OFF period, said control switch during said ON period conducting an input current provided by said input voltage source;
    an output stage coupled to said input stage, said output stage including an output terminal providing said output voltage to the load during said ON period and said OFF period, the value of said output voltage dependent on the ON period relative to the OFF period; and controller means adapted to vary said ON and OFF period of said control switch to provide discontinuous mode operation, said ON period being such that said control switch remains ON until said input current is substantially equal to a predetermined value and said OFF period being inversely proportional to said output voltage.

16. The system according to claim 15, wherein said control switch is a transistor switch, the gate of said transistor switch being responsive to said controller for turning ON and OFF.

17. The system according to claim 16, wherein said controller further comprise:

means for sensing said input current during said ON period, said means producing a sensing voltage having an instantaneous value indicative of the instantaneous value of said current;

capacitance means coupled to said sensing means;

means for forcing the voltage across said capacitance means to follow said sensing voltage such that said transistor switch remains ON until said capacitance means is charged to a first determined voltage;

means for decoupling said capacitance means from said sensing means at the end of said ON period; and means for providing a discharge current proportional to said output voltage for said capacitance means during said OFF period such that said transistor switch remains OFF until said capacitance means is discharged by said discharge current to a second predetermined voltage.

18. The system according to claim 17, further comprising:

a first comparator means having a reference voltage substantially equal to said first predetermined voltage said comparator providing an indication when voltage across said capacitance means is substantially equal to said first predetermined voltage; and a second comparator means for providing an indication when voltage across said capacitance means is substantially equal to said second predetermined voltage.

19. The system according to claim 18, further comprising:

error amplifier responsive to said output voltage, adapted to provide an error voltage when said output voltage deviates from a reference voltage;

means for coupling said error voltage with said output voltage such that said means for providing discharge current is responsive to said output voltage and said error voltage.

20. The system according to claim 19, wherein said first comparator means is provided with a variable voltage reference.

21. The system according to claim 20, further comprising means for controlling said variable voltage reference of said first comparator in response to said error voltage.

22. A method for providing an output voltage to a load in a DC converter, employing a pulse width modulated switching, said method comprising the steps of:

providing DC input voltage;

generating an ON period and an OFF period, such that during said ON period a current is provided by said input voltage;

varying said ON period of said switch, such that said ON period is inversely proportional to said input voltage when said converter is a buck-boost derived converter;

varying said ON period of said switch such that said ON period of said switch is inversely proportional to the difference between said input voltage and said output voltage when said converter is a buck-derived converter; and varying said OFF period of said switch such that said OFF period is inversely proportional to said output voltage.

23. The method according to claim 22, wherein said step of generating an ON period and an OFF period includes the step of turning ON and OFF a transistor switch.

24. The system according to claim 23, further comprising the step of:

providing a charging current proportional to said input voltage when said converter is a buck-boost derived converter;

providing a charging current proportional to the difference between said input voltage and said output voltage when said converter is a buck-derived converter;

providing a discharging current proportional to said output voltage; and maintaining said ON period for charging a capacitance means by said charging current to a first predetermined voltage; and maintaining said OFF period for discharging said capacitance means by said discharging current to a second predetermined voltage.

25. The method according to claim 24, further comprising the steps of:

providing an indication when voltage across said capacitance means is substantially equal to said first predetermined voltage; and providing an indication when voltage across said capacitance means is substantially equal to said second predetermined voltage.

26. The method according to claim 25 further comprising the steps of:

providing an error voltage when said output voltage deviates from a reference voltage; and coupling said error voltage with said input voltage such that said charging current is responsive to said input voltage and said error voltage when said converter is a buck-boost converter and;

coupling said error voltage with said input voltage and said output voltage such that said charging current is responsive to said input voltage and to said output voltage and to said error voltage when said converter is a buck-derived converter.

27. The system according to claim 26, further comprising the step of coupling said error voltage with said output voltage such that discharging current source is responsive to said output voltage and said error voltage when said converter is a buck-derived converter.

* * * * *